(12) United States Patent
Balakrishnan et al.

(10) Patent No.: US 8,947,972 B2
(45) Date of Patent: Feb. 3, 2015

(54) DYNAMIC ADDRESS GROUPING FOR PARALLEL PROGRAMMING IN NON-VOLATILE MEMORY

(71) Applicant: SanDisk 3D LLC, Milpitas, CA (US)

(72) Inventors: Gopinath Balakrishnan, Santa Clara, CA (US); Tz-Yi Liu, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 29 days.

(21) Appl. No.: 13/839,300

(22) Filed: Mar. 15, 2013

(65) Prior Publication Data

US 2014/0281135 A1    Sep. 18, 2014

(51) Int. Cl.
   *G11C 8/18*       (2006.01)
   *G06F 12/02*      (2006.01)

(52) U.S. Cl.
   CPC .................................. *G06F 12/0246* (2013.01)
   USPC ................. 365/233.16; 365/191; 365/189.07; 365/207; 365/230.07

(58) Field of Classification Search
   CPC ............ G06F 12/0246; G06F 12/1416; G06F 9/3851; G06F 21/79; G06F 9/3814; G06F 9/30145; G06F 9/3816; G06F 9/382; G06F 9/30152; H04W 12/08; H04W 36/0055; H04L 49/25
   USPC ........... 365/233.16, 191, 189.07, 207, 230.07
   See application file for complete search history.

(56) References Cited

U.S. PATENT DOCUMENTS

| | | | |
|---|---|---|---|
| 4,926,312 A | 5/1990 | Nukiyama | |
| 5,890,192 A | 3/1999 | Lee | |
| 6,029,226 A | 2/2000 | Ellis | |
| 6,201,738 B1 | 3/2001 | Hebishima | |
| 6,735,104 B2 | 5/2004 | Scheuerlein | |
| 7,111,140 B2 | 9/2006 | Estakhri | |

(Continued)

FOREIGN PATENT DOCUMENTS

| EP | 1282134 | 2/2003 |
|---|---|---|
| WO | WO2006/130438 | 12/2006 |

(Continued)

OTHER PUBLICATIONS

U.S. Appl. No. 13/839,366, filed Mar. 15, 2013.

(Continued)

*Primary Examiner* — Thong Q Le
(74) *Attorney, Agent, or Firm* — Vierra Magen Marcus LLP

(57) ABSTRACT

A non-volatile memory system evaluates user data before writing in order to potentially group addresses for writing within a cycle. The system can determine which sense amplifier addresses of a column address will be programmed in a column address cycle. The number of bits that will be programmed is compared with an allowable number of parallel bits. The system generates groups of sense amplifier addresses based on the comparison. The system generates groups that include a total number of bits to be programmed that is within the allowable number of parallel bits. Each group is programmed in one sense amplifier address cycle. Multiple sense amplifier addresses can be grouped for programming while still remaining within an allowable number of parallel programming bits. The system performs a read before write operation and generates bitmap data for the grouping information corresponding sense amplifier addresses.

22 Claims, 14 Drawing Sheets

(56) References Cited

U.S. PATENT DOCUMENTS

| | | |
|---|---|---|
| 7,142,471 B2 | 11/2006 | Fasoli |
| 7,219,271 B2 | 5/2007 | Kleveland et al. |
| 7,243,203 B2 | 7/2007 | Scheuerlein |
| 7,383,476 B2 | 6/2008 | Crowley |
| 7,424,593 B2 | 9/2008 | Estakhri |
| 7,490,283 B2 | 2/2009 | Gorobets |
| 7,499,366 B2 | 3/2009 | Scheuerlein |
| 7,502,260 B2 | 3/2009 | Li |
| 7,545,689 B2 | 6/2009 | Ilkbahar et al. |
| 7,685,376 B2 | 3/2010 | Zimmer et al. |
| 7,804,724 B2 | 9/2010 | Way |
| 7,966,532 B2 | 6/2011 | Bottelli et al. |
| 8,004,926 B2 | 8/2011 | Sutardja et al. |
| 8,213,243 B2 | 7/2012 | Balakrishnan et al. |
| 8,223,525 B2 | 7/2012 | Balakrishnan et al. |
| 8,374,051 B2 | 2/2013 | Yan et al. |
| 8,397,024 B2 | 3/2013 | Fasoli et al. |
| 2001/0005876 A1 | 6/2001 | Srinivasan |
| 2001/0017798 A1 | 8/2001 | Ishii |
| 2002/0041527 A1 | 4/2002 | Tanaka |
| 2002/0136045 A1 | 9/2002 | Scheuerlein |
| 2004/0188714 A1 | 9/2004 | Scheuerlein |
| 2004/0190360 A1 | 9/2004 | Scheuerlein |
| 2004/0250183 A1 | 12/2004 | Crowley |
| 2004/0255088 A1 | 12/2004 | Scheuerlein |
| 2006/0077720 A1* | 4/2006 | Im ............................ 365/185.28 |
| 2006/0146639 A1 | 7/2006 | Fasoli |
| 2007/0147133 A1* | 6/2007 | Im ............................ 365/185.28 |
| 2008/0151637 A1 | 6/2008 | Doyle |
| 2009/0161474 A1 | 6/2009 | Scheuerlein |
| 2009/0244987 A1 | 10/2009 | Cernea |
| 2010/0046267 A1 | 2/2010 | Yan |
| 2010/0146189 A1 | 6/2010 | Otterstedt et al. |
| 2010/0265750 A1 | 10/2010 | Yan |
| 2011/0047330 A1 | 2/2011 | Potapov et al. |
| 2011/0141788 A1 | 6/2011 | Balakrishnan et al. |
| 2011/0141832 A1* | 6/2011 | Balakrishnan et al. .. 365/189.16 |
| 2012/0275210 A1 | 11/2012 | Yan et al. |

FOREIGN PATENT DOCUMENTS

| | | |
|---|---|---|
| WO | WO2012/118618 A1 | 9/2012 |
| WO | WO2012/129083 A1 | 9/2012 |

OTHER PUBLICATIONS

International Search Report & The Written Opinion of the International Searching Authority dated Jun. 4, 2014, International Application No. PCT/US2014/019741.

* cited by examiner

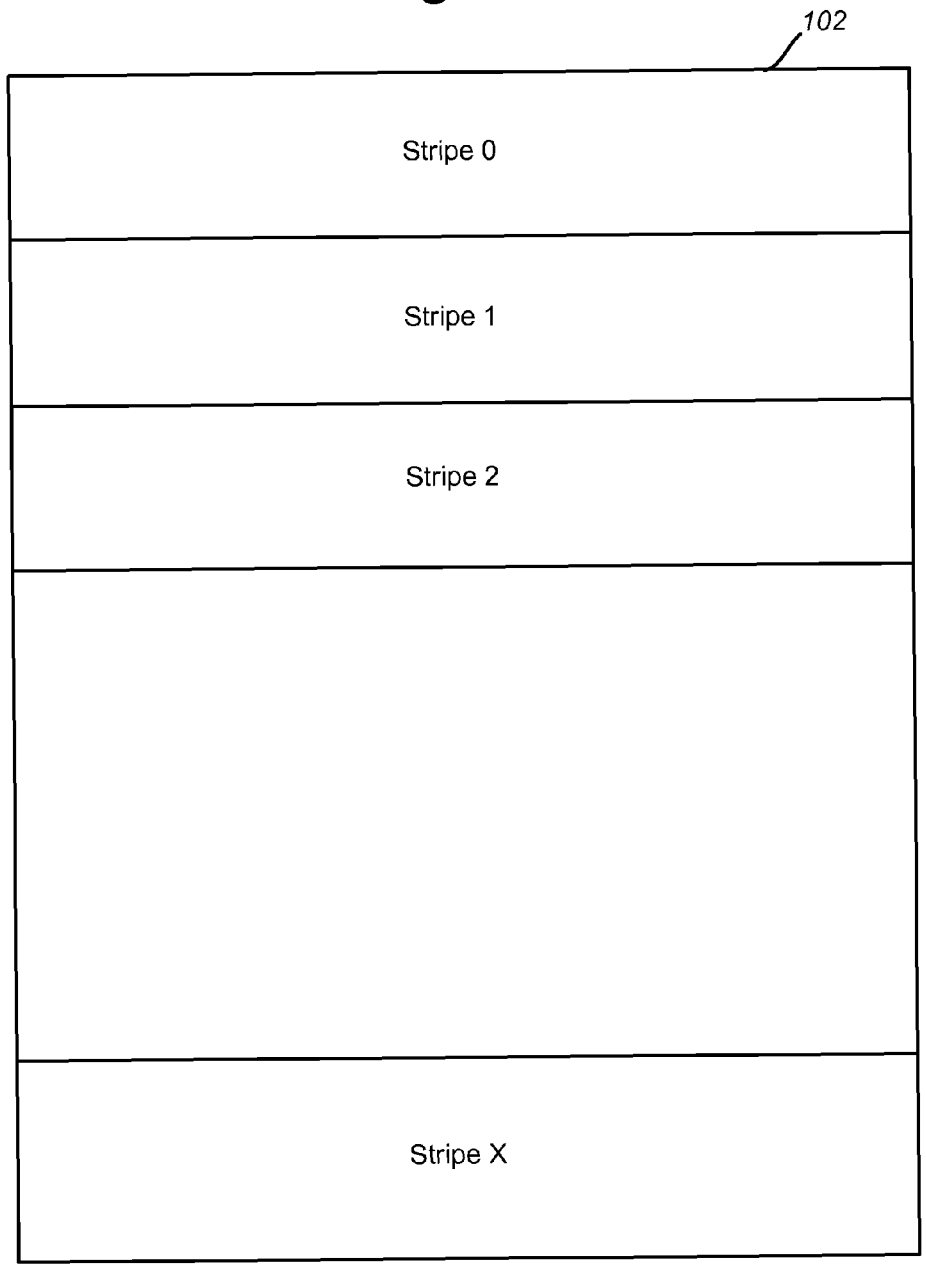

DYNAMIC ADDRESS GROUPING FOR PARALLEL PROGRAMMING IN NON-VOLATILE MEMORY

BACKGROUND

1. Field of the Invention

Embodiments of the present disclosure are directed to high density semiconductor devices, such as non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

BRIEF DESCRIPTION OF THE DRAWINGS

FIG. 6 depicts one example organization of a memory array.

DETAILED DESCRIPTION

In many memory operations, some bits of user data will not be programmed during particular sense amplifier address cycle. Accordingly, a non-volatile memory system is provided that evaluates user data before writing in order to potentially group sense amplifier addresses for writing in one sense amplifier address cycle. The system can determine which sense amplifier addresses of a column address will actually be programmed in a column address cycle. The number of bits that will be programmed can be compared with an allowable number of parallel bits. The system generates groups of sense amplifier addresses that include two or more sense amplifier addresses based on the comparison. The system generates groups that include a total number of bits to be programmed that is within the allowable number of parallel bits. Each group is then programmed in one sense amplifier address cycle. In this manner, multiple sense amplifier addresses can be grouped for programming while still remaining within an allowable number of parallel programming bits. In one embodiment, the system performs a read operation to read a memory allocation in the array corresponding to the user data prior to performing a write operation for the user data. The system generates bitmap data for the grouping information corresponding sense amplifier addresses.

Figure 1:
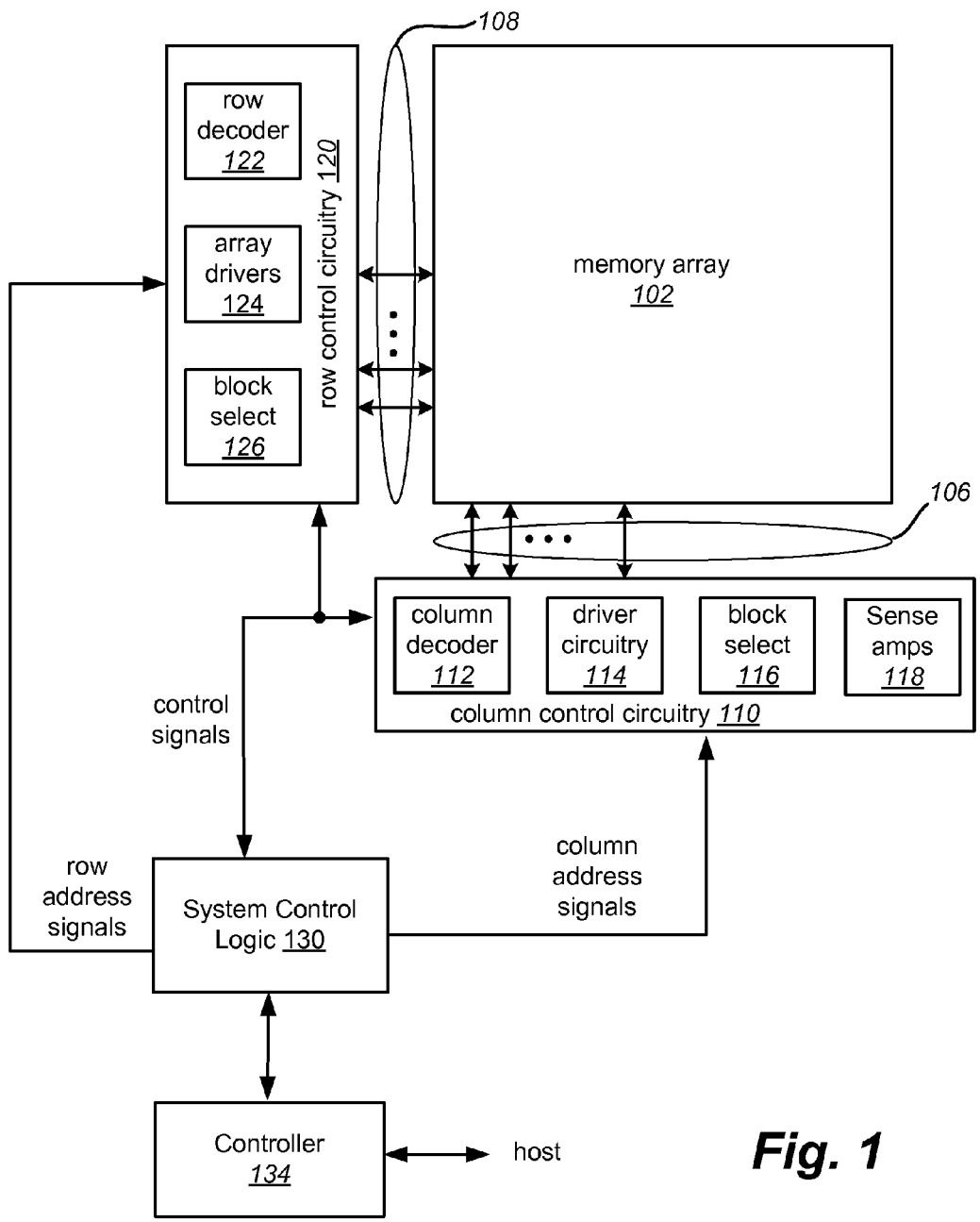
FIG. 1 is a block diagram of one embodiment of a memory system.

FIG. 1 is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
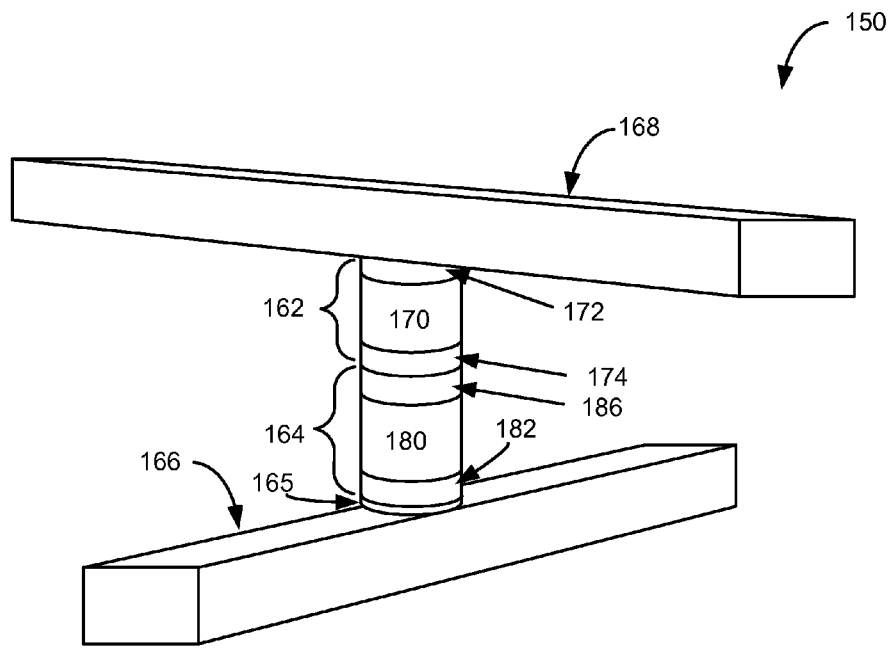
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element using a selective deposition process and then annealed and/or oxidized (if necessary). In other embodiments Hafnium oxide may be deposited by an atomic layer deposition process using a precursor containing Hafnium.

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_1$—$XCa_XMnO_3$ (PCMO), $La_1$—$XCa_XMnO_3$ (LCMO), LaSrMnO$_3$ (LSMO), or $GdBaCo_xO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in United States Patent Application Publication No. 2009/0323391, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
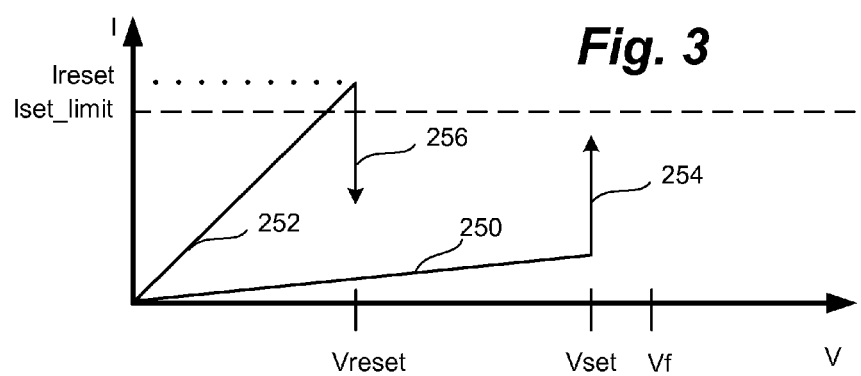
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in United States Patent Application 2009/0323391, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET. One example of this capacitive discharge method can be found in United States Patent Application 2009/0323393, "Capacitive Discharge Method For Writing To Non-Volatile Memory," filed on Dec. 19, 2008, incorporated herein by reference in its entirety.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
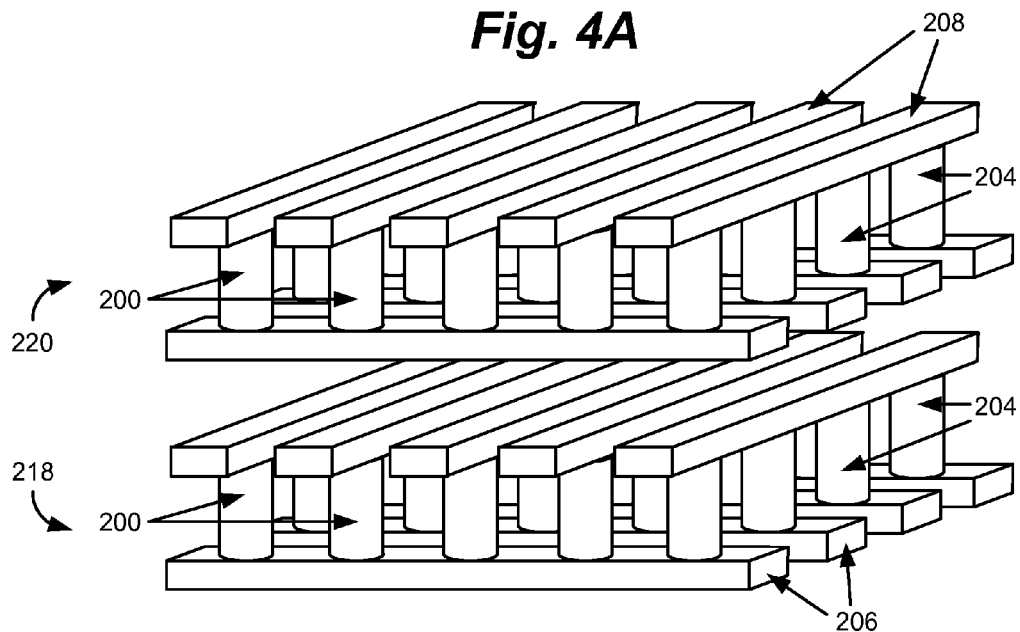
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
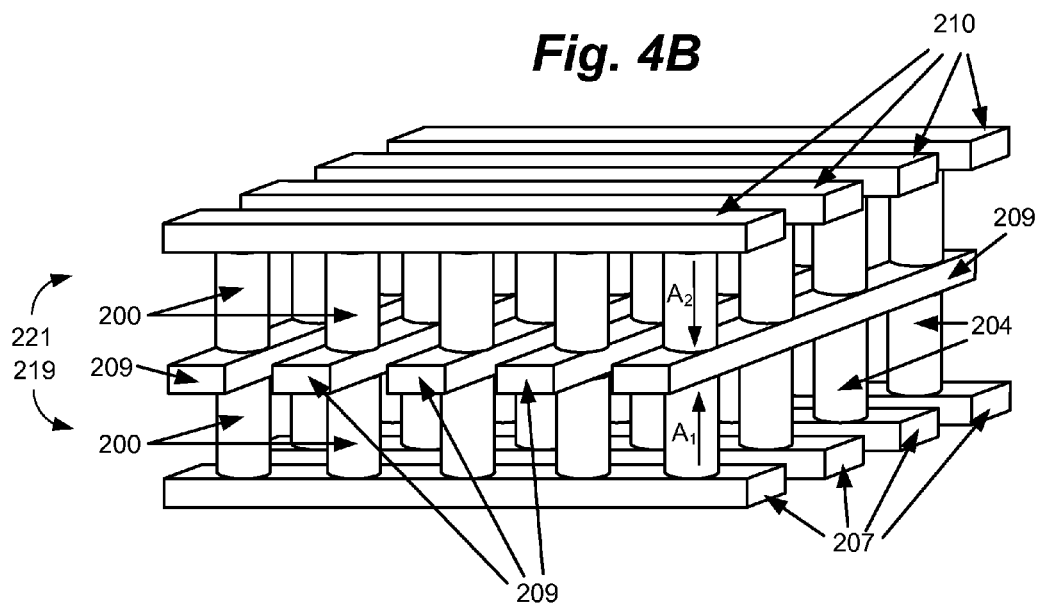
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952, 030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
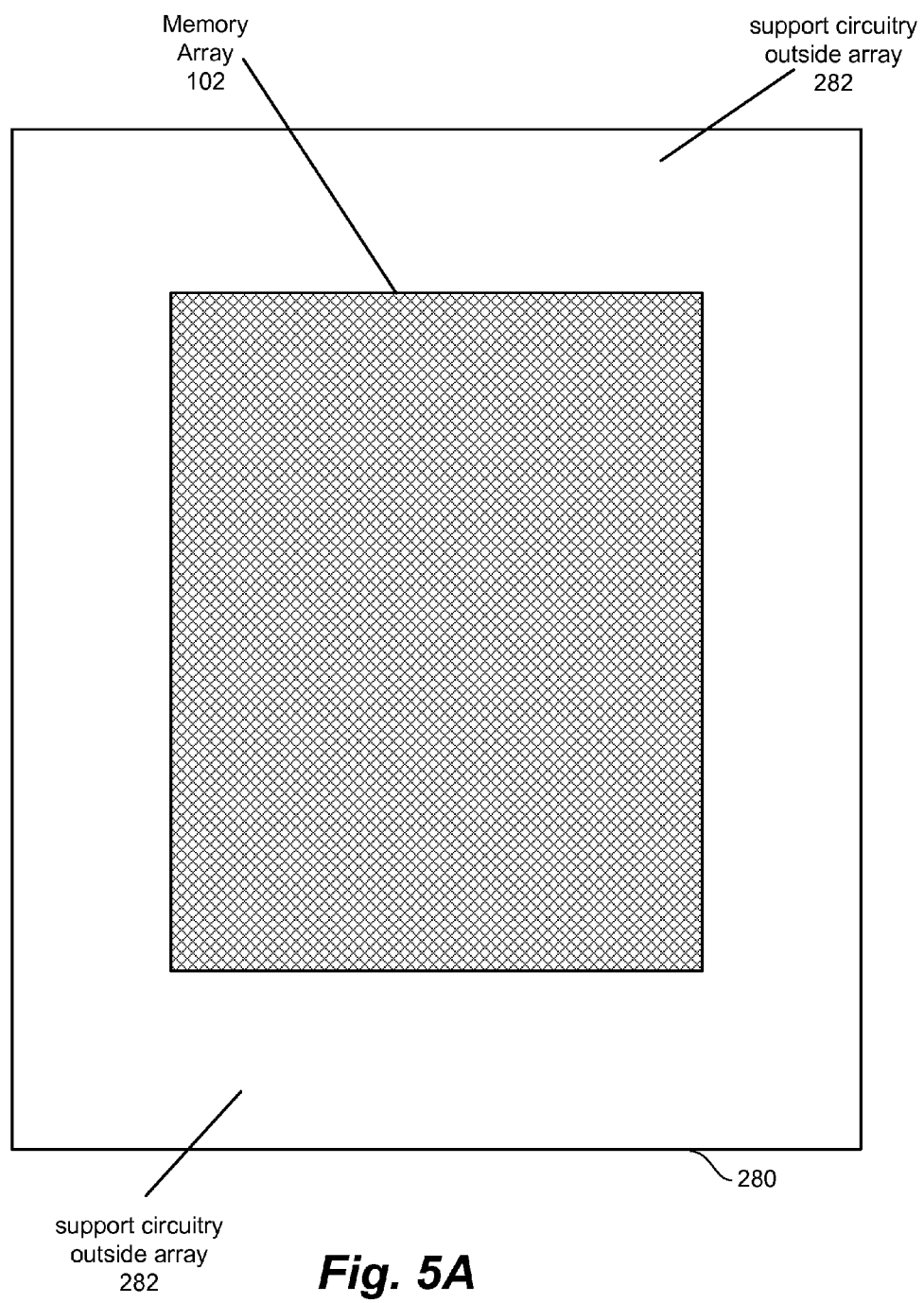
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
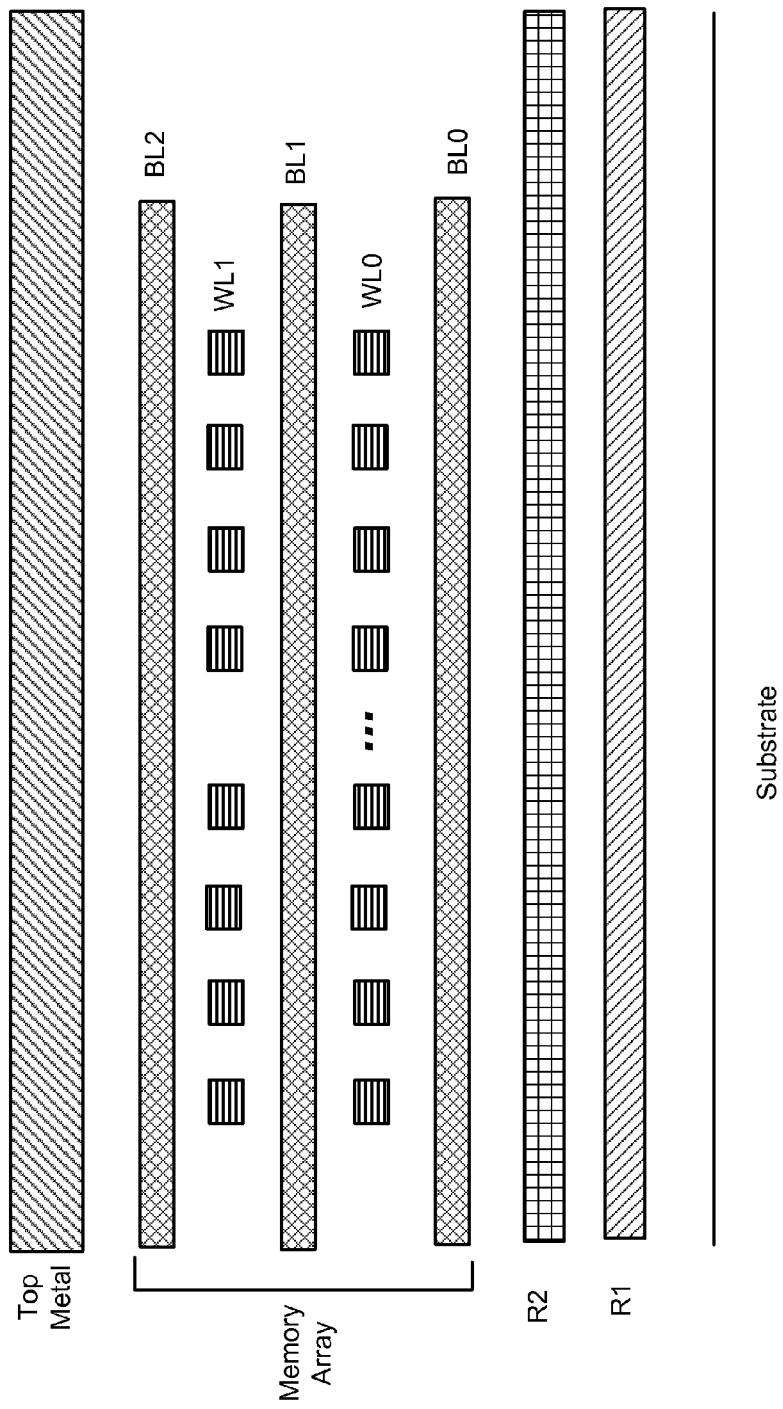
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Memory array 102 is subdivided into stripes, as depicted in FIG. 6. Each stripe is divided into blocks and blocks are grouped into bays. In one embodiment, each block includes two stripes. In other embodiments, one bay can be implemented in one strip or a portion of one stripe. In some implementations, a bay can be implemented across all or portions of two or more stripes. Each bay includes multiple blocks. The number of blocks in a bay can vary.

Figure 7:
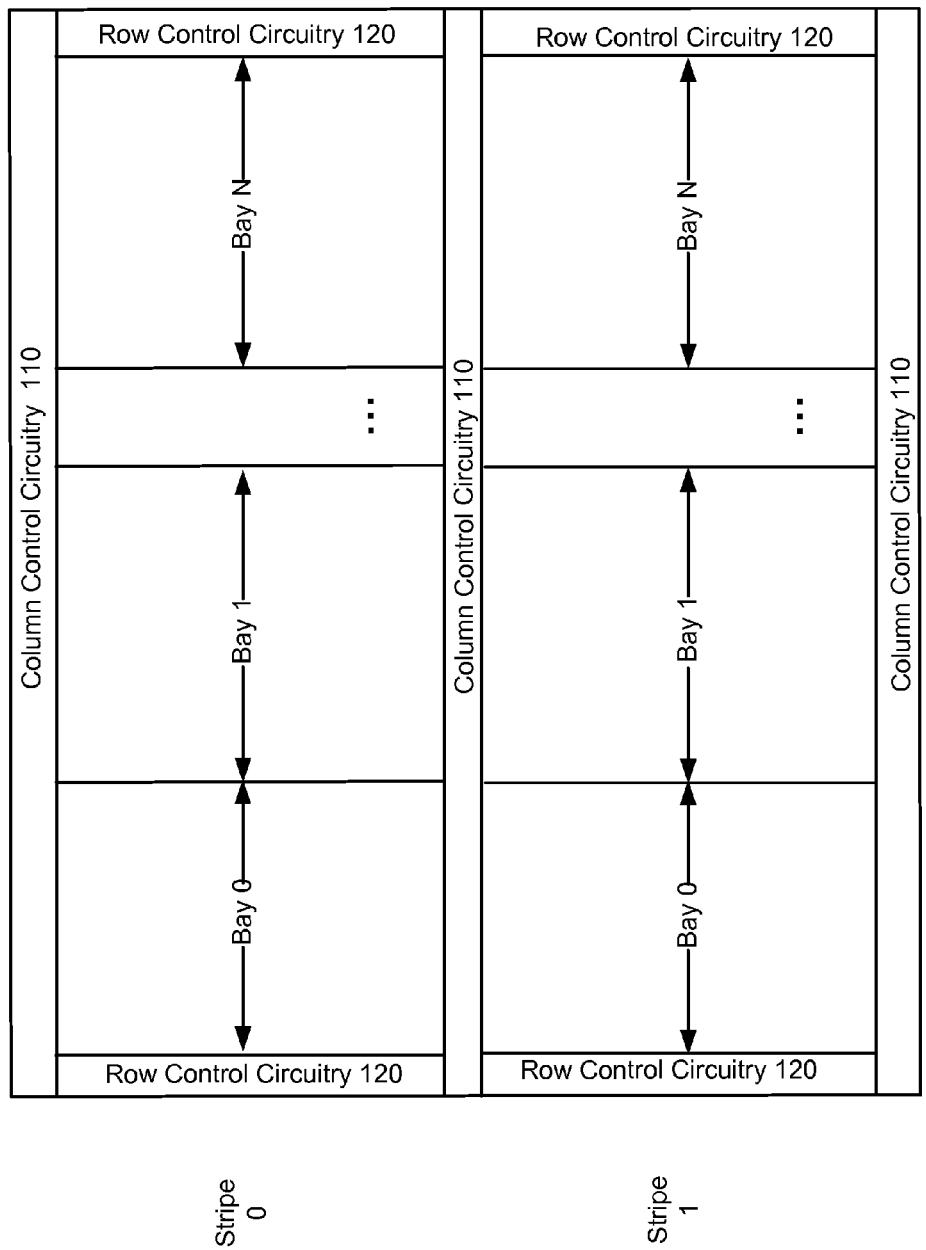
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
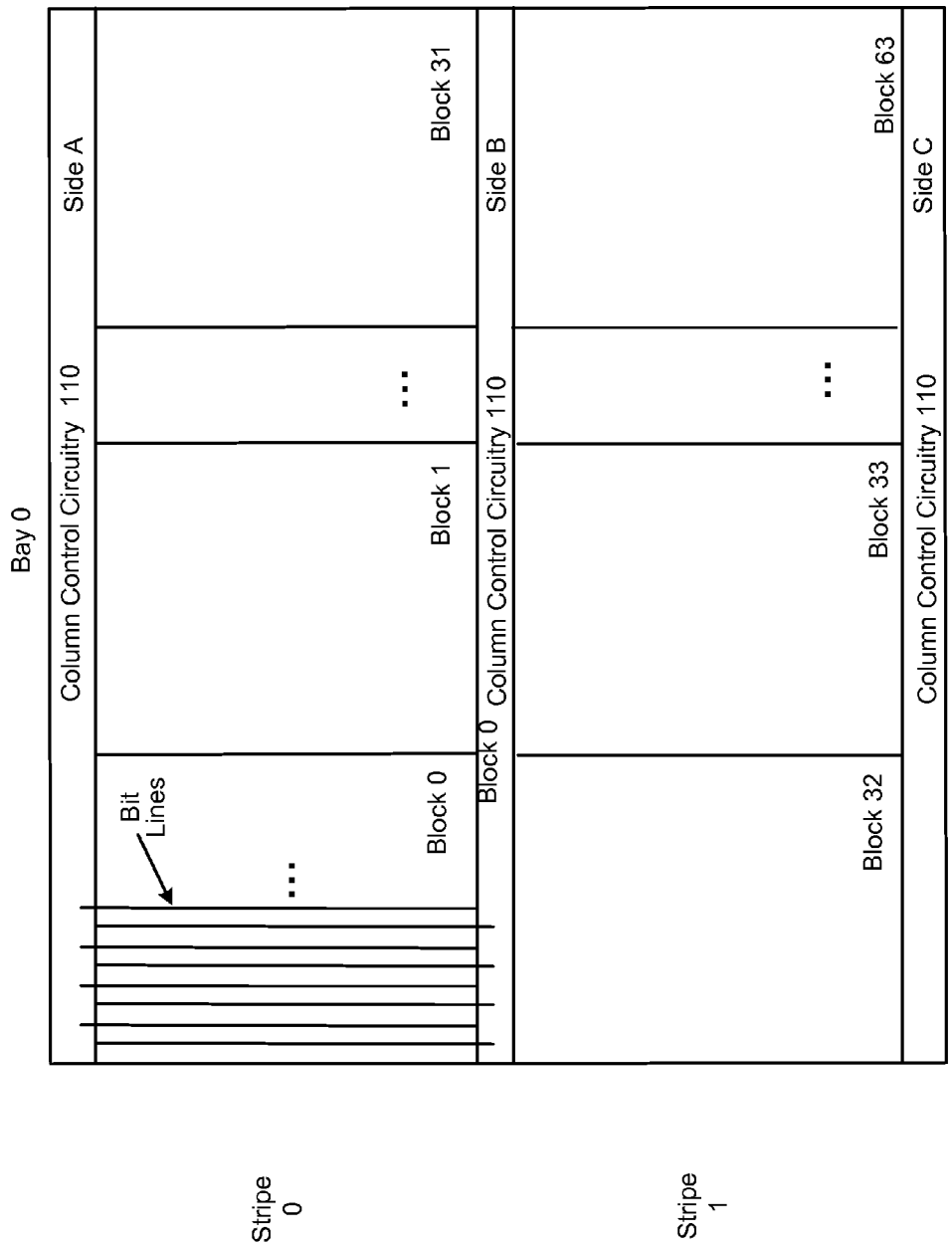
FIG. 8 depicts one embodiment of a bay.

FIG. 8 provides more details of one example bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and driver bit lines for its upper or bottom blocks.

In one set of embodiments, word lines (not depicted in FIG. 8) will be shared by two adjacent blocks. For example, half of the word lines connected to Block 1 will also be connected to Block 0 and the other half of the word lines connected to Block 1 will also be connected to Block 2. In one example implementation, every other word line connected to Block 1 will also be connected to Block 0, with the intervening word lines being also connected to Block 2. For embodiments word lines shared by two adjacent blocks, the word line drivers will be positioned on the substrate and between the two adjacent blocks. For example, a word line connected to Block 0 and Block 1 will be driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

In previous systems, global routing lines for routing signals between the 64 (or less) selected memory cells and the sense amplifiers were implemented in metals layers R1 or R2, which have a relatively large resistance and capacitance. To reduce overall resistance and capacitance, some previous designs have implemented half of the global routing lines for routing signals between the selected memory cells and the sense amplifiers in R1 (or R2) and the other half of the global routing lines for routing signals between the selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
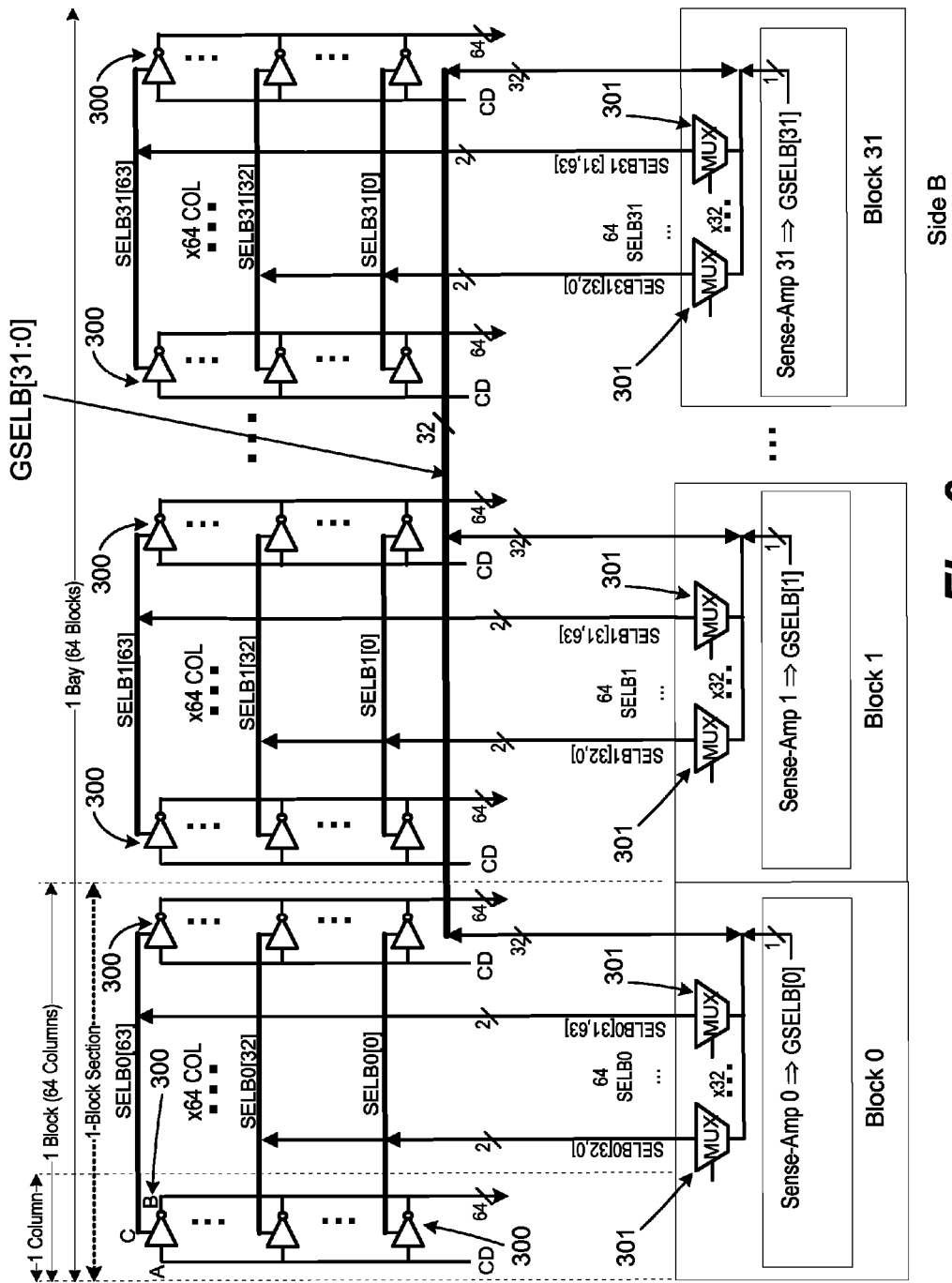
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB0[63:0], block 1 includes SELB1[63:0], . . . block 31 includes SELB31 [63:0]. In one embodiment, the local data lines SELB0[63:0], SELB1[63:0], . . . SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], . . . or SELB31[63:0]). As can be seen from FIG. 9, each of the selection circuits 300 receives a selection signal CD from column decoders 112 and a bit line connection from one of the 64 bit lines associated with the column. In one embodiment, each column will have its own selection signal CD. Based on the selection input from column decoder 112, the selection circuit 300 will connect or disconnect the bit line to a respective one of the local data lines (e.g., SELB0 [63:0], SELB1[63:0], . . . SELB31[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], . . . or SELB31[63:0]). Each block has its own set of thirty two 2:1 multiplexers (e.g., MUX 301) that are associated with the block and located on the substrate below the block. Each set of sixty four local data lines (SELB0[63:0], SELB1[63:0], . . . or SELB31[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[33], . . . the thirty second multiplexer receives SELB0[31] and SELB0 [63]. Each of the multiplexers in a block receives a common selection signal and an enable signal from column decoders 112 so that thirty two of the sixty four local data lines are selected. In one embodiment, the multiplexers include the ability to bias the unselected SELB with the unselected bit line voltage VUB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB [1], etc. The global data lines GSELB[31:0] are implemented in Top Metal and connections between global data lines GSELB[31:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[31:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB [1], . . . and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
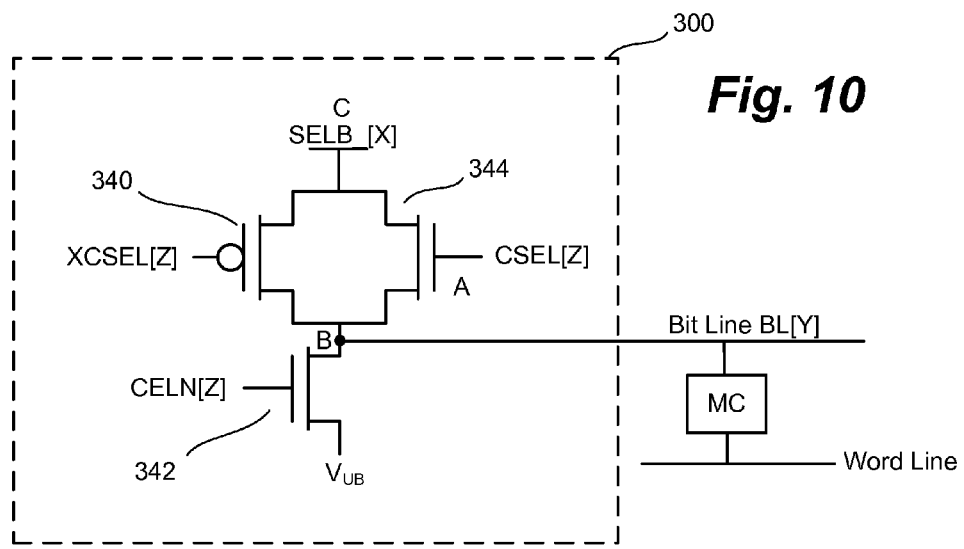
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes p-channel transistor 340 and n-channel transistor 344 both connected to SELB_[X] at node C. Transistor 340 and transistor 344 are also both connected to n-channel transistor 342 at node B. The respective bit line BL[Y] is also connected to node B. Transistor 342 is also connected to VUB (e.g. 0.5v), the unselected bit line voltage. The gate of transistor 340 is connected to selection signal XCSEL[Z]. The gate of transistor 344 is connected to selection signal CSEL[Z] at node A. Note that XCSEL[Z] is an inverted version of CSEL[Z]. The gate of transistor 342 is connected to CELN[Z]. The signals CSEL[Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z]. CSEL[Z] of FIG. 10 is analogous to CD of FIG. 9.

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL [Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB via the n-channel transistor 342. When transistors 340 and 344 are off and CELN[Z] is 0, then transistor 342 is off and the bit line BL[Y] is floating. This condition is useful for the some embodiments of the capacitance discharge method of programming described herein.

Figure 11:
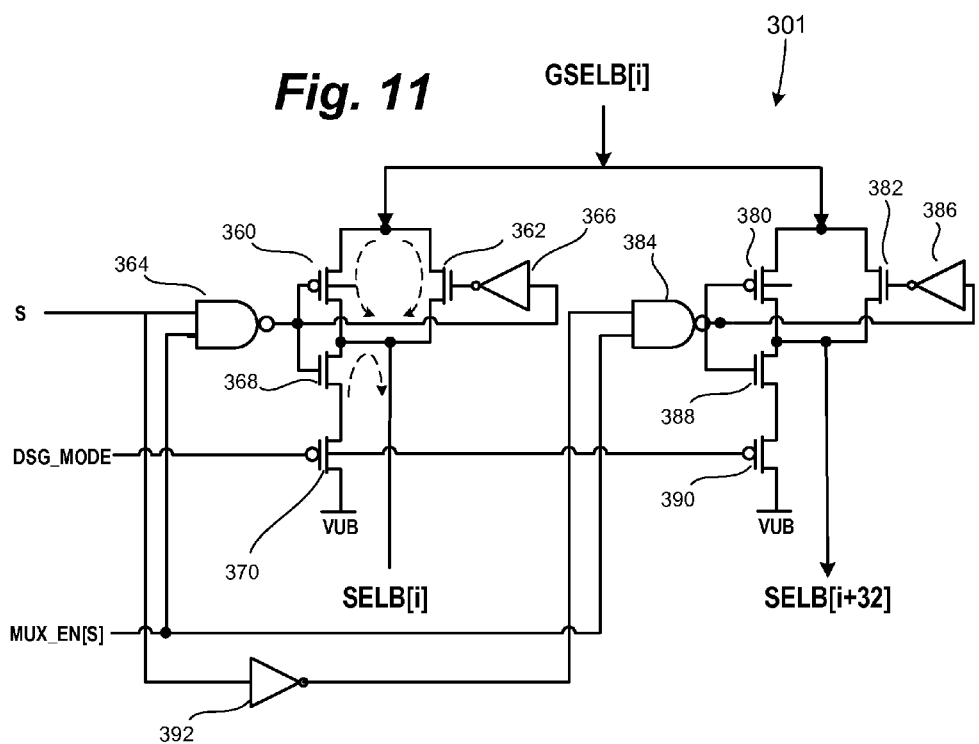
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 1 when performing one of the possible embodiments of the programming operation using the capacitance discharge mode of programming described herein. By setting signal DSG_MODE to 1, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 390 receives the signal DSG_MODE from system control logic 130. When DSG_MODE is set to 0 and SELB[i] is selected, SELB[i+32] receives VUB via p-channel transistor 390 (in some embodiments). When DSG_MODE is set to 0 SELB[i+32] is selected, SELB[i] receives VUB via p-channel transistor 370 (in some embodiments). The signal DSG_MODE is designed for use with the capacitive discharge method described above. When DSG_MODE is set to 1, SELB[i] can be charged up according to the data pattern. The signal MUX_EN[S] is disabled, and the signals SELB[i] and BL[i] are floating. The selected word line goes low and selected memory cells are programmed.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming. In one embodiment, two different MUX_EN[S] signals each connected to half the multiplexors are used to selectably connect half the GSELB bus to half of the local SELB[i] bus. In this case sixteen bit lines can be selected for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers for side B are in communication with thirty two memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, the selected bit lines will also be charged. Once the bit lines are charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection (discussed below) can change so that programming for the next word line will commence.

For many memory arrays, like that of FIG. 9, write operations are divided into cycles. Many chip architectures divide write processes into bay address (BAD) cycles so that less than all of the bays are written simultaneously. Each bay may be written separately or multiple bays may be grouped together into a bay group that is written during one bay address (BAD) cycle. A single bay address (BAD) may correspond to one bay address (BAD) cycle. For example, if the memory array is divided into sixteen bays and the bays are divided into eight bay groups with two bays in each bay group, there are eight bay addresses for programming the sixteen bays in eight BAD cycles. If each bay is programmed individually, there are sixteen BAD's for programming the sixteen bays in sixteen cycles.

BAD cycles may be divided into column address (CAD) cycles. In many architectures, the number of sense amplifiers (sense amps) for the memory array is less than the number of bits written during a typical write operation. For example, consider an example where each bay has 32 blocks and each block includes one sense amplifier and 32 columns. The sense amplifiers in each bay can access each block within the bay. Additionally, the sense amplifiers in each bay can access each block within the same stripe. Nevertheless, the memory capacity of the available sense amplifiers for a write operation is less than the amount of data received for most program commands.

For example, typical requests to write data to the memory array include a unit or group of data referred to as a page of data. While page sizes may vary by implementation, it is common for a page of data or the page size to be 2048 KB. Because the capacity of the available sense amps to program a page of data is less than 2048 KB, the program or write operation is divided into cycles to sequentially program the page of data in chunks that are less than the total page size. In the above example, the total number of sense amps on the chip is equal to the product of the number of sense amps per bay (32) multiplied by the number of bays (16), or 512 in this example. If the page size for programming is 2048 KB and each sense amp is capable of storing one bit of data, a page of data received with a write request is programmed in 32 different cycles, with each cycle programming 512 bits. These cycles, defined by the quotient of the page size and the total number of sense amps, are typically referred to as column address (CAD) cycles. Each BAD cycle will thus include multiple CAD cycles. A column address (CAD) can be used to refer to one column address (CAD) cycle, where the CAD cycle writes one or more columns in each block for the BAD cycle.

In addition to BAD cycles and CAD cycles, many memory systems divide the write operation into sense amp address cycles for power consumption control and other reasons such as program disturb. For example, while every sense amp can be enabled at a given time during write operations, many chip architectures enable less than all of the sense amps at a given time to minimize power consumption and undue voltage drops or currents on chip. In the above example, the 32 sense amplifiers for a bay may be divided into 8 sense amplifier addresses for programming in individual cycles for each column address. In this example, each cycle will program 4 bits in parallel. This number of bits can be referred to as the number of allowable parallel programmable bits. The architecture may establish that the maximum number of bits that should be programmed in a block is less than the available number of sense amplifiers for the reasons noted above. For example, if a single sense amplifier is enabled at a time for each CAD cycle, there would be 32 sense amplifier addresses and cycles within each CAD cycle. If two sense amplifiers were enabled in each CAD cycle, the number of SAD cycles for each CAD cycle would be 16, etc. A sense amp address (SAD) can be used to refer to one sense amp address (SAD) cycle.

It is possible that not all of the memory cells for a particular address cycle are to be programmed. For example, not all of the bits for a column address cycle may be programmed. Consider a binary system that uses a set operation to set memory cells from a logical '0' to a logical '1.' The bits of the user data that are to remain logical '0' are not be programmed. They will not be subjected to a program voltage pulse according to a sense amp enable signal provided during the write operation. In this manner, these bits will not be programmed during the column address cycle because they will not be enabled for programming.

Recognizing that some bits of user data will not be programmed during particular sense amplifier address cycles, a non-volatile memory system is provided that evaluates user data before writing in order to potentially group sense amplifier addresses for writing in one sense amplifier address cycle. The system can determine which sense amplifier addresses of a column address will actually be programmed in a column address cycle. The number of bits that will be programmed can be compared with an allowable number of parallel bits. The system generates groups of sense amplifier addresses that include two or more sense amplifier addresses based on the comparison. The system generates groups that include a total number of bits to be programmed that is within the allowable number of parallel bits. Each group is then programmed in one sense amplifier address cycle. In this manner, multiple sense amplifier addresses can be grouped for programming while still remaining within an allowable number of parallel programming bits. In one embodiment, the system performs a read operation to read a memory allocation in the array corresponding to the user data prior to performing a write operation for the user data. The system generates bitmap data for the grouping information corresponding to sense amplifier addresses.

Figure 12:
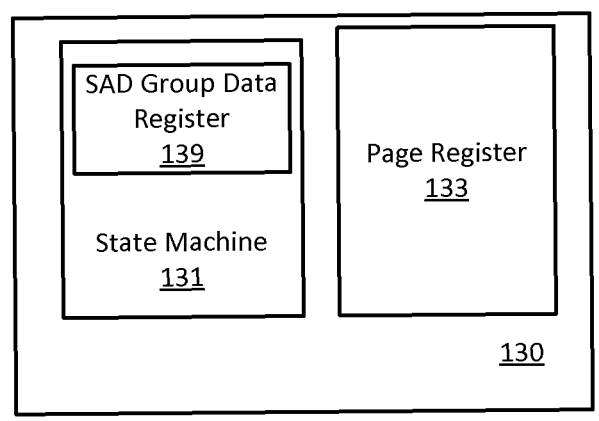
FIG. 12 is a block diagram of system control logic in one embodiment.

FIG. 12 is a block diagram of system control logic in accordance with one embodiment. System control logic 130 includes state machine 131, page register 133, and a group data register 135. In one embodiment, a logical page of data is the minimum unit of data used for programming. Thus, memory is programmed and read in sets of pages. Page register 133 includes a register that can store a logical page of data for reading and writing. A page is typically implemented across multiple blocks as earlier described. In one embodiment, a page includes 2048 bytes of data and 128 bytes of header information (e.g., including ECC) for a total of 2176 bytes. Page register 133 will also include logic circuits to manipulate the data before writing (e.g., data encoding) and for verifying whether data read after a write process matches the data intended to be written (e.g., verify operation). The page register serves as an intermediate storage device with respect to the host and the memory array.

State machine 131 can include circuitry for providing various voltages, and other control circuitry. State machine 131 is used to control the reading and writing of data. FIG. 12 shows state machine 131 in communication with page register 133. In one embodiment, page register 133 includes control logic which can include a circuit(s) (digital and/or analog circuits) used to control page register. Data received by page register 133 can be processed to perform various data encoding, add ECC (error correction codes), or other functions. The data can be transferred to the support circuitry for the appropriate memory stripe for programming into memory array 102. Data read from memory array 102 is provided from the appropriate support circuitry for the appropriate memory stripe to the page register. The page register control logic can perform various decoding, ECC and verification processes. The final data is transferred to system control logic 130, controller 134 and/or the host.

Group data register 135 contains bitmap data generated for sense amplifier addresses. The state machine evaluates the user data to determine the actual bits to be programmed during each column address cycle. Based on the evaluation, the state machine generates bitmap data for the sense amplifier addresses of the column address cycles. The bitmap data indicates groupings of sense amplifier addresses for programming in the same sense amplifier address cycle. In this manner, the number of bits programmed in a cycle can be maintained within an allowable number of parallel bits, while increasing write bandwidth and saving power in the memory system.

Figure 13:
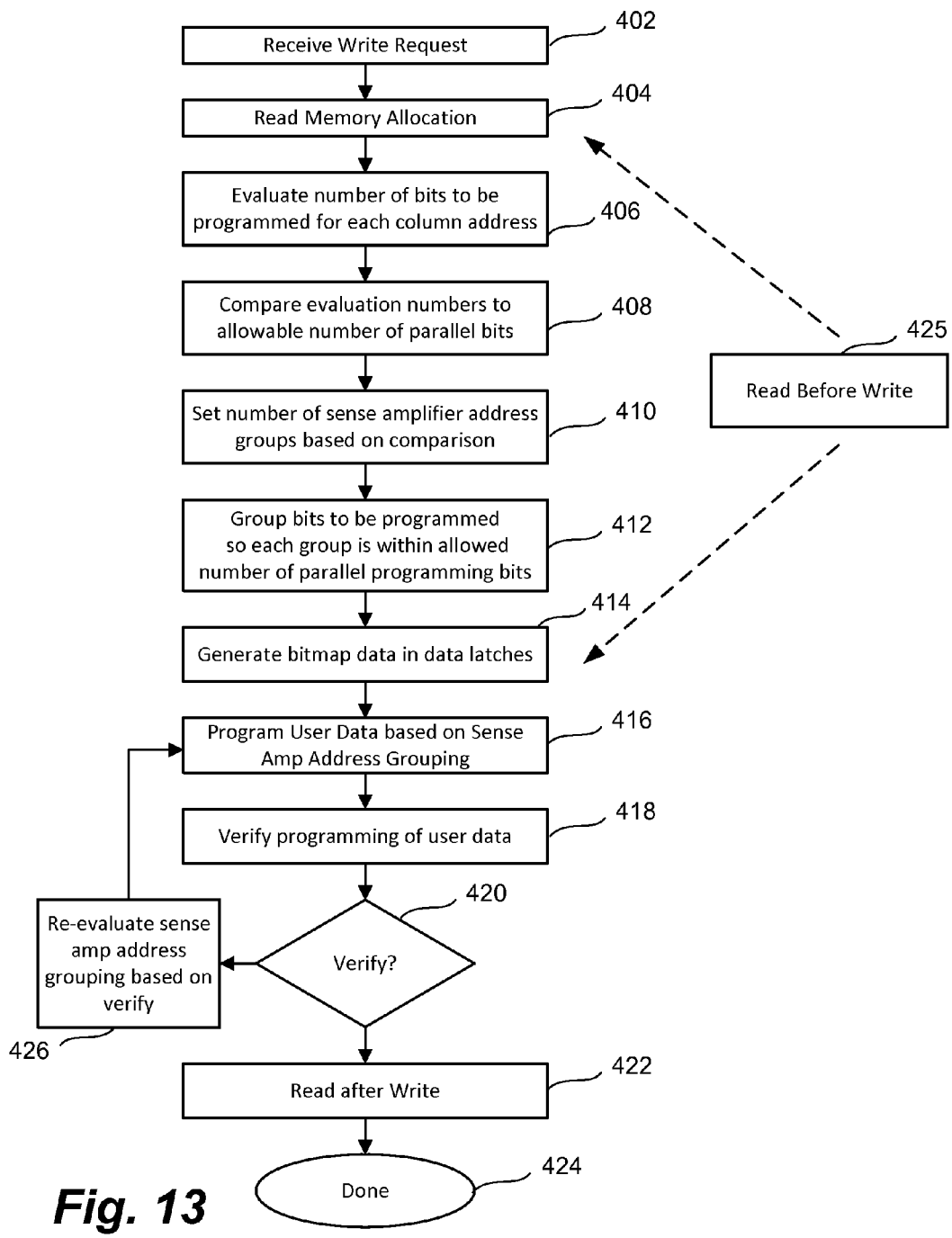
FIG. 13 is a flowchart describing a process for evaluating user data for grouping and programming the user data using groupings.

FIG. 13 is flowchart describing a process for programming user data that includes grouping the programmable bits within an address cycle to increase write bandwidth. At step 402, a request to write data to the memory system is received. In one example, the request includes or is provided with the data to be written. A page of data is received at step 402 in one embodiment although other units of programming or writing can be received. The request and data are received at a state machine 131 in one embodiment. In another example, the request and data are received at controller 132. At step 404, the memory system begins a read before write operation 425 prior to beginning the write operation for the user data. The system determines the memory allocation in the memory array for satisfying the write request and reads the existing memory data from the allocated memory. Although shown sequentially, steps 404-414 will be performed simultaneously in one embodiment to evaluate the grouping while reading the data.

At step 406, the state machine evaluates the user data. The state machine evaluates the user data for each column address individually. For each column address, the state machine evaluates the number of bits to be programmed. Step 406 can include evaluating the total number of bits to be programmed for each column address, the number of bits to be programmed for each sense amplifier address within the column address, or the number of bits to be programmed for various groupings of sense amplifier addresses within the column address.

At step 408, the state machine compares one or more of the evaluated numbers of bits from step 406 to an allowable threshold for programming. In one embodiment, the allowable threshold is an allowable threshold of programming bits. This allowable threshold can be an allowable number of parallel programming bits, that is, the maximum number of bits that can be programmed in parallel. The allowable number of parallel programming bits may be referred to as the allowable number of parallel bits for conciseness. Step 408 may include comparing the total number of bits for a column address to the allowable number of parallel bits. Step 408 can further include comparing the number of bits for groupings of sense amplifier addresses of the column address to the allowable number of parallel bits. More details regarding step 406 and 408 are provided in FIG. 14.

At step 410, the state machine determines the number of sense amplifier address groups for grouping the sense amplifier addresses in the column address cycle. Step 410 is based on the comparison of the number of bits to be programmed for the column address to the number of allowable parallel bits for programming in a sense amplifier address cycle. The state machine can compare the total number of bits for a column address to the number of allowable parallel bits. The number of groups is based on the quotient of the number of bits to be programmed and the allowable number of parallel bits in one example. The number of groups may be set to the quotient, rounded up to the nearest whole number. A specific example is provided below with respect to FIG. 14.

At step 412, the bits to be programmed for the column address are grouped according to the number of groups determined in step 410. The state machine places the bits into the groups to maintain the number of bits being programmed at less than the number of allowable parallel bits. The state machine can organize the sense amplifier addresses into groups so that each group contains a number of bits to be programmed that is less than the allowable number of parallel bits. At step 414, the state machine generates bitmap data and stores it in the group database 135. The bitmap data contains the group information from step 412 to enable programming according to the groups during the subsequent write operation. The bitmap data can be maintained according to the sense amplifier addresses.

Notably, by grouping the sense amplifier addresses the memory system can increase write bandwidth without exceeding the number of allowable parallel bits. The sense amplifier addresses can be grouped so that an individual group may contain more sense amplifiers than the maximum allowable parallel bits. Because the addresses are grouped according to the bits that will actually undergo programming, the number of bits being programmed will not exceed the allowable number of parallel bits.

At step 416, the state machine programs the user data based on the sense amplifier address groupings. Within a column address, the state machine writes each sense amplifier address group in a single sense amplifier address cycle. The number of sense amplifiers or programmable bits may exceed the allowable number of parallel bits. However, the groups are organized so that the bits that are to be programmed in the cycle does not exceed the allowable number.

After writing each sense amplifier address group, the state machine verifies programming of the user data at step 418. The state machine reads the data written at step 416. Step 416 can include determining whether all, or a predetermined number of the targeted bits were successfully programmed. If the user data is verified at step 420, a read after write operation is performed at step 422 to read back the data from the memory allocation targeted for the user data. At step 424, the request to write information is completed.

If programming the user data is not successfully verified at step 420, the state machine re-evaluates the sense amplifier groupings and generates updated bitmap data at step 426. The state machine re-examines the data read during verification at step 418 to determine the number of bits to be programmed for each column address. The sense amplifiers can be grouped again based on which bits need to be programmed during the next programming iteration. In this manner, the state machine can generate more efficient groupings after bits are successfully verified at step 418. The successfully programmed bits are not reprogrammed. Thus, the corresponding sense amplifier addresses can be regrouped based on the bits that are to be programmed again.

Figure 14:
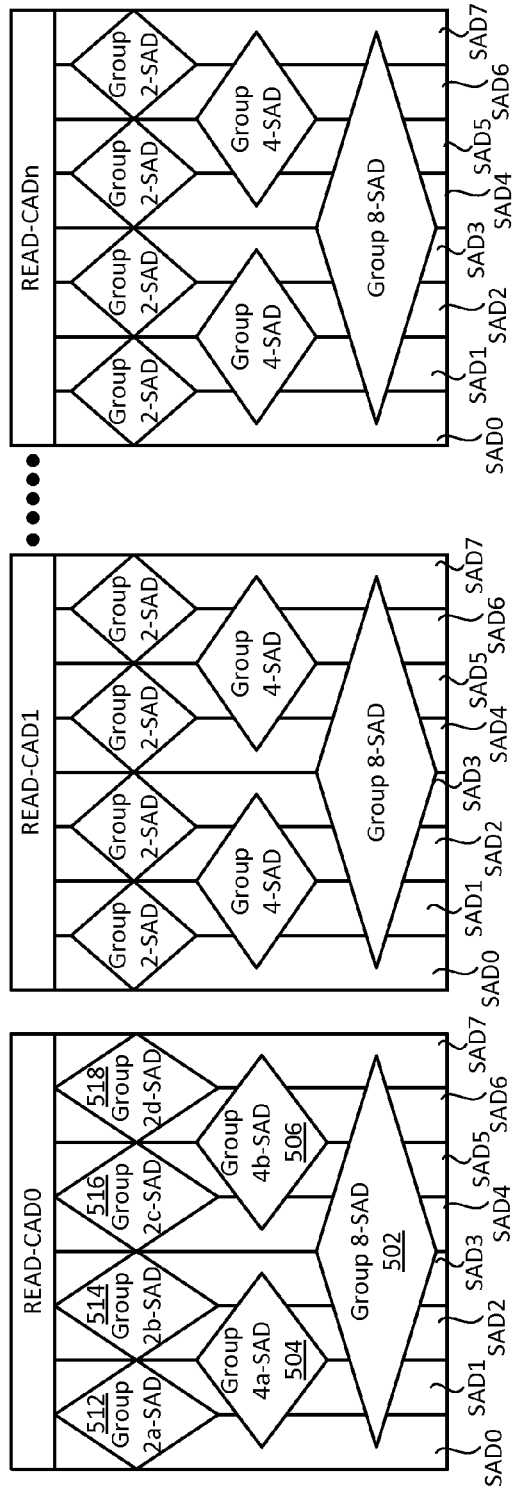
FIG. 14 is a block diagram depicting a process for evaluating grouping within a column address.

FIG. 14 is a block diagram describing a specific example of grouping sense amplifier address cycles. For example, the process of FIG. 14 can be used to group the bits to be programmed as set forth in FIG. 13. In FIG. 14, an example is presented with each column address including eight sense amplifier addresses. Each sense amplifier address may correspond to one or more sense amplifiers. For example, if 32 sense amplifiers are included in a bay, and are available to each block, each sense amplifier address may correspond to four sense amplifiers. Although not required, the number of allowable parallel bits may be four, so that each sense amplifier address includes a number of sense amplifiers equal to the number of allowable parallel bits. In this manner, each SAD cycle can program the maximum number of allowable parallel bits.

For each column address, e.g., CAD0, the state machine first determines at 502 whether the total number of bits to be programmed for the column address is within the number of allowable parallel bits. Continuing with the example above, the state machine can determine the total number of bits to be programmed for CAD0; the sum of the bits to be programmed for each sense amplifier address. If the total number of bits to be programmed is less than or equal to four, the state machine creates a single sense amplifier address group, Group 8-SAD. The group includes every sense amplifier address SAD0-SAD7 of the column address CAD0. Because the total number of bits for the column is less than the allowable number of bits, they can all be programmed together. Accordingly, the sense amplifier addresses are placed into a single group that is programmed in a single sense amplifier address cycle.

If the state machine determines that the total number of bits for the column address exceeds the allowable number of parallel bits, it evaluates a subset of the sense amplifier addresses for grouping at 504 and 506. In this example, the state machine evaluates the first four sense amplifier addresses for grouping and the last four sense amplifier addresses for grouping. The state machine divides the sense amplifier addresses into two equally sized groups of four. The state machine determines whether the total number of bits to be programmed for the sense amplifier addresses of each group is within the allowable number of programmable bits. In this example, the state machine determines whether the number of bits to be programmed for sense amplifier addresses SAD0-SAD3 is Equal to or Less than the Allowable Number of Parallel Bits. The State machine also determines whether the number of bits to be programmed for sense amplifier addresses SAD4-SAD8 is equal to or less than the allowable number of parallel bits. These steps can be performed sequentially or in parallel. If the total number of bits for SAD0-SAD3 is less than or equal to four, the state machine creates the sense amplifier address group Group 4a-SAD at 504, including sense amplifier addresses SAD0-SAD3. If the total number of bits for SAD4-SAD7 is less than or equal to four, the state machine creates the SAD group Group 4b-SAD at 506. Each group contains four sense amplifier addresses, representing 16 sense amplifiers, and thus potential memory cells for programming. By determining during the evaluation prior to writing that that each group in total will only have four bits programmed, they can be grouped into a single SAD group and programmed in one SAD cycle.

If the state machine determine that Group 4a-SAD contains a number of bits to be programmed that exceeds the allowable number of parallel bits, the state machine evaluates grouping for SAD0 and SAD1 at 512, and grouping for SAD2 and SAD3 at 514. Again, the state machine divides the earlier grouping in half and evaluates whether the sense amplifier addresses can be grouped. The state machine determines whether the total number of bits to be programmed for SAD0 and SAD1 is less than or equal to four and whether the number of bits to be programmed for SAD2 and SAD3 is less than or equal to four. If the number of bits for SAD0 and SAD1 is within the allowable number, the state machine creates Group 2a-SAD at 512. Group 2a-SAD includes SAD0 and SAD1 and will be programmed in a single sense amplifier address cycle. If the number of bits is within the allowable number for SAD2 and SAD3, the state machine creates Group 2b-SAD at 514. Group 2b-SAD includes SAD2 and SAD3 and will be programmed in a single sense amplifier address cycle. If the number of bits in Group 4b-SAD is not within the allowable number of parallel bits, the state machine performs a similar evaluation for Groups 2c-SAD at 516 and Group 2d-SAD.

If the state machine determines that any of the groups at 512-518 contain a total number of bits to be programmed that is greater than the allowable number of parallel bits, the corresponding sense amplifier address group is not created. The sense amplifier address can be programmed normally in its own sense amplifier address cycle. After evaluating the first column address CAD0 of the BAD cycle, the state machine evaluates the next column address CAD1 in the same manner. Processing continues until all column addresses for all bay address cycles have been evaluated.

In one embodiment, the number of data latches used to store the bitmap data is based on the number of address cycles. The number of latches is based on the number of bay address cycles, column address cycles and sense address cycles in one embodiment. For example, the number of data latches can be set to the product of L, n, and (m−1) or (L*n*(m−1)). L is the number of bay address cycles, n is the number of column address cycles, and m is the number of sense address cycles. A number of tracks may be used for providing the bitmap data or transferring it between the state machine and the data latches. The number of tracks in one embodiment is equal to the product of (m−1) and (L/2).

Figure 15:
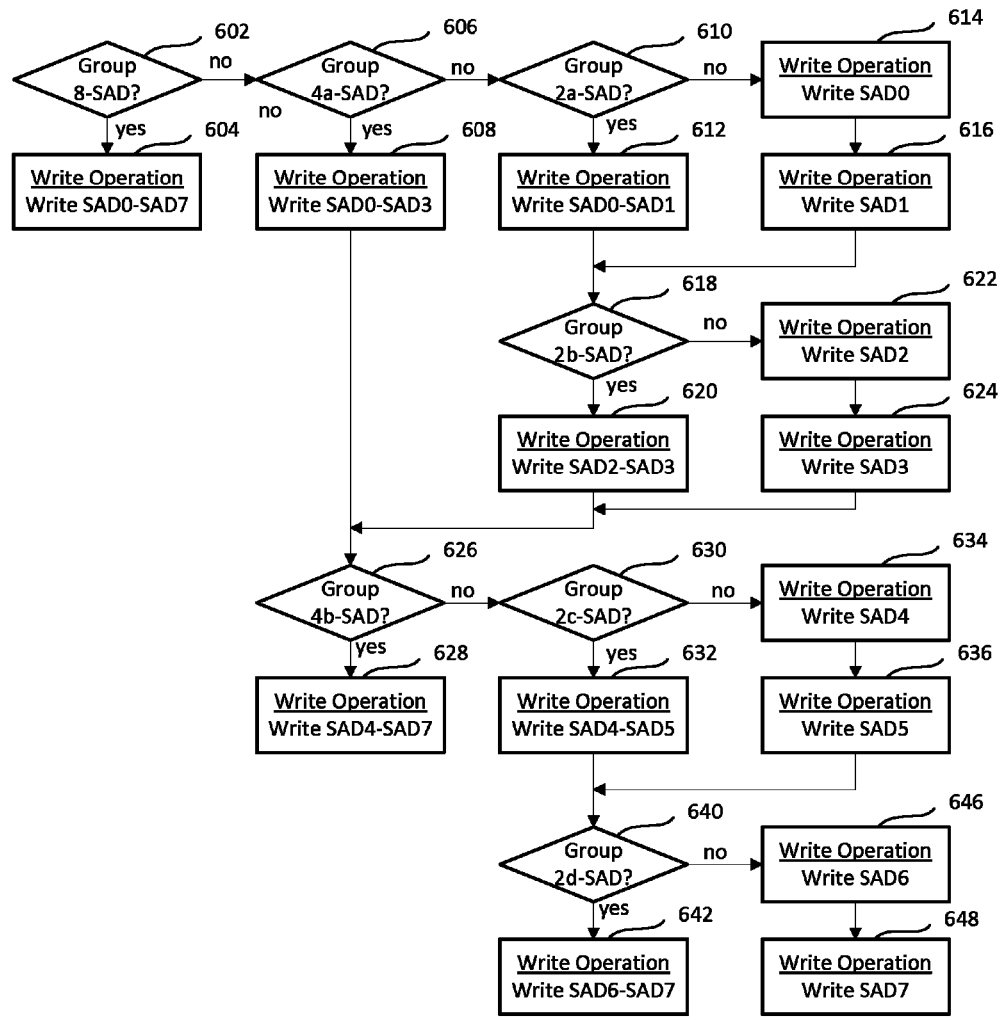
FIG. 15 is a flowchart describing a process for writing user data using bitmap data to indicate sense amplifier address grouping.

FIG. 15 is a flowchart describing a method of programming user data based on a sense amplifier address groupings in one embodiment. In one example, the process of FIG. 15 can be performed at step 416 of FIG. 13. FIG. 15 provides a specific example with the sense amplifier addresses described in FIG. 14.

The state machine accesses the bitmap data for the current column being processed during writing. At step 602, the state machine determines whether the bitmap data indicates or includes an identifier for the Group 8-SAD sense address group. If the bitmap data includes Group 8-SAD, the state machine executes a single sense amplifier address cycle containing all sense amplifier addresses SAD0-SAD7 for the column address. In this example, the state machine condenses eight individual sense amplifier addresses into a single senses amplifier address cycle for programming. Despite the total number of potential bits in the sense amplifier addresses exceeding the allowable parallel bits, the group can be programmed together because of the evaluation performed at the read before write stage. By determining that the number of bits to be programmed for the entire column does not exceed the allowable number of parallel bits, the group is used to perform a single write operation in one sense amplifier address cycle.

If the bitmap data does not identify the Group 8-SAD sense address group, the state machine determines whether the bitmap data includes an identifier for the Group 4a-SAD group at step 606. If the bitmap data includes the Group 4a-SAD identifier, the state machine executes a write operation for the Group 4a-SAD group at step 608. The write operation for group Group 4a-SAD programs sense amplifier addresses SAD0-SAD3 in one sense amplifier address cycle.

If the bitmap does not identify Group 4a-SAD, the state machine determines whether the bitmap data includes an identifier for the Group 2a-SAD group at step 610. If the bitmap data includes the Group 2a-SAD identifier, sense amplifier addresses SAD0 and SAD1 are programmed together at step 612 in a single sense amplifier address cycle. If the bitmap data does not include the Group 2a-SAD identifier, the state machine performs the write operation for sense amplifier address SAD0 at step. The state machine performs the write operation for sense amplifier address SAD1 at step 616. At steps 614 and 616, the state machine programs these addresses in individual sense amplifier address cycles based on determining that no group can be created with the two sense amplifier addresses that would not exceed the allowable number of parallel bits. Steps 614 and 616 can be performed in any order.

After performing the write operation for Group 2a-SAD at step 612, or individual write operations for SAD0 and SAD1 at steps 614 and 616, the state machine determines at step 618 whether the bitmap data includes an identifier for Group 2b-SAD. If the bitmap data includes the identifier Group 2b-SAD, sense amplifier addresses SAD2 and SAD3 are programmed together at step 620 in a single sense amplifier address cycle. If the bitmap data does not identify Group 2b-SAD, the state machine performs a write operation for SAD2 at step 622 in one SAD cycle and another write operation for SAD3 at step 624 in another SAD cycle.

After performing the write operation for Group 4a-SAD at step 608, the write operation for Group 2b-SAD at step 620, or individual write operations for SAD2 and SAD3 at steps 622 and 624, the state machine determines at step 626 whether the bitmap data includes an identifier for Group 4b-SAD. If the bitmap data includes the identifier for Group 4b-SAD, the state machine performs a write operation for Group 4b-SAD at step 628. The write operation programs sense amplifier addresses SAD4-SAD7 in a single SAD cycle at step 628.

If the bitmap does not identify Group 4b-SAD, the state machine determines whether the bitmap data includes an identifier for Group 2c-SAD at step 630. If the bitmap data includes the identifier for Group 2c-SAD, sense amplifier addresses SAD4 and SAD5 are programmed together at step 632 in a single sense amplifier address cycle. If the bitmap data does not include the identifier for Group 2c-SAD, the state machine performs a write operation for SAD4 at step 634 in one SAD cycle and another write operation for SAD5 at step 636 in another SAD cycle.

After performing the write operation for Group 2c-SAD at step 632, or individual write operations for SAD4 and SAD5 at steps 634 and 636, the state machine determines at step 640 whether the bitmap data includes an identifier for Group 2d-SAD. If the bitmap data includes the identifier Group 2d-SAD, sense amplifier addresses SAD6 and SAD7 are programmed together at step 642 in a single sense amplifier address cycle. If the bitmap data does not include the identify Group 2d-SAD, the state machine performs a write operation for SAD6 at step 646 in one SAD cycle and another write operation for SAD7 at step 648 in another SAD cycle.

Accordingly, a method of programming non-volatile storage has been disclosed that includes identifying a set of address cycles for writing user data in response to a write request and generating bitmap data for the set of address cycles based on the user data to be programmed for individual address cycles of the set. The bitmap data associates two or more address cycles of the set having a number of programmable bits within an allowable threshold. The method includes programming the user data to be written during the two or more address cycles of the set in one address cycle based on the bitmap data.

A non-volatile memory system has been disclosed that includes a non-volatile memory array, a set of data latches, and one or more control circuits in communication with the plurality of non-volatile storage elements and the set of data latches. The one or more control circuits identify a set of address cycles for writing user data in response to a write request and generate bitmap for the set of address cycles based on the user data to be programmed for individual address cycles of the set. The bitmap data associates two or more address cycles of the set having a number of programmable bits within an allowable threshold. The one or more control circuits stores the bitmap data for the set of address cycles and programs the user data to be written during the two or more address cycles of the set in one address cycle based on the bitmap data.

A method of programming non-volatile storage has been disclosed that includes receiving a request to write a set of user data, identifying a set of sense amplifier addresses corresponding to a column address for writing the set of user data, comparing a number of bits of the user data to be programmed for the column address with an allowable number of parallel programmable bits, and grouping at least two sense amplifier addresses of the set of sense amplifier addresses into a first group based on a total number of bits to be programmed for the at least two sense amplifier addresses being less than the allowable number of programmable bits.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile storage, comprising:
   identifying a set of address cycles for writing user data in response to a write request;
   generating bitmap data for the set of address cycles based on the user data to be programmed for individual address cycles of the set, the bitmap data associates two or more address cycles of the set having a number of programmable bits within an allowable threshold; and
   programming the user data to be written during the two or more address cycles of the set in one address cycle based on the bitmap data.

2. A method according to claim 1, wherein:
   each of the two or more address cycles corresponds to a different sense amplifier address; and
   generating bitmap data includes grouping the two or more address cycles into a sense amplifier address group.

3. A method according to claim 2, wherein generating bitmap data includes generating bitmap data for the different sense amplifier addresses to generate a group including the two or more address cycles.

4. A method according to claim 3, wherein:
the allowable threshold is an allowable number of bits that can be programmed in parallel.

5. A method according to claim 4, further comprising:
evaluating the user data to determine a number of bits to be programmed for the two or more sense amplifier addresses;
comparing the number of bits to be programmed for the two or more sense amplifier addresses to the allowable number of bits that can be programmed in parallel; and
generating the group including the two or more address cycles based on comparing the number of bits to be programmed with the allowable number of bit that the can be programmed.

6. A method according to claim 5, wherein:
the allowable number of bits that can be programmed is equal to a number of sense amplifiers corresponding to each address cycle; and
a number of sense amplifiers corresponding to the sense amplifier addresses of the two or more address cycles is more than the allowable number of bits that can be programmed in parallel.

7. A method according to claim 1, wherein:
programming the user data includes programming the user data to a three dimensional non-volatile memory array.

8. A non-volatile memory system, comprising:
a non-volatile memory array;
a set of data latches; and
one or more control circuits in communication with the plurality of non-volatile storage elements and the set of data latches, the one or more control circuits configured to identify a set of address cycles for writing user data in response to a write request and generate bitmap for the set of address cycles based on the user data to be programmed for individual address cycles of the set, wherein the bitmap data associates two or more address cycles of the set having a number of programmable bits within an allowable threshold, the one or more control circuits configured to store the bitmap data for the set of address cycles and program the user data to be written during the two or more address cycles of the set in one address cycle based on the bitmap data.

9. A non-volatile memory system according to claim 8, wherein:
the one or more control circuits configured to perform a read before write operation in response to the write request for the user data; and
the one or more control circuits configured to generate the bitmap data for the set of address cycles during the read before write operation.

10. A non-volatile memory system according to claim 9, wherein:
each of the two or more address cycles corresponds to a different sense amplifier address; and
the bitmap data groups the two or more address cycles into a sense amplifier address group.

11. A non-volatile memory system according to claim 10, wherein the one or more control circuits configured to generate bitmap data includes bitmap data for the different sense amplifier addresses to generate a group including the two or more address cycles.

12. A non-volatile memory system according to claim 11, wherein:
the allowable threshold is an allowable number of bits that can be programmed in parallel.

13. A non-volatile memory system according to claim 12, wherein:
the one or more control circuits configured to evaluate the user data to determine a number of bits to be programmed for the two or more sense amplifier addresses;
the one or more control circuits configured to compare the number of bits to be programmed for the two or more sense amplifier addresses to the allowable number of bits that can be programmed in parallel; and
the one or more control circuits configured to generate the group including the two or more address cycles based on comparing the number of bits to be programmed with the allowable number of bit that the can be programmed.

14. A non-volatile memory system according to claim 13, wherein:
the allowable number of bits that can be programmed is equal to a number of sense amplifiers corresponding to each address cycle; and
a number of sense amplifiers corresponding to the sense amplifier addresses of the two or more address cycles is more than the allowable number of bits that can be programmed in parallel.

15. A non-volatile memory system according to claim 8, wherein the non-volatile memory array is a three dimensional non-volatile memory array.

16. A method of programming non-volatile storage, comprising:
receiving a request to write a set of user data;
identifying a set of sense amplifier addresses corresponding to a column address for writing the set of user data;
comparing a number of bits of the user data to be programmed for the column address with an allowable number of parallel programmable bits; and
grouping at least two sense amplifier addresses of the set of sense amplifier addresses into a first group based on a total number of bits to be programmed for the at least two sense amplifier addresses being less than the allowable number of programmable bits.

17. A method according to claim 16, further comprising:
programming the first group including the at least two sense amplifier addresses in a single sense amplifier address cycle.

18. A method according to claim 16, wherein:
each sense amplifier address of the set corresponds to two or more sense amplifiers.

19. A method according to claim 16, wherein comparing includes determining that a total number of bits to be programmed for the set of sense amplifier addresses is less than the allowable number of parallel programmable bits.

20. A method according to claim 19, further comprising:
grouping each sense amplifier address of the set into the first group; and
programming the first group including each sense amplifier address of the set in a single sense amplifier address cycle.

21. A method according to claim 16, wherein:
comparing includes determining that a total number of bits to be programmed for the set of sense amplifier addresses is more than the allowable number of parallel programmable bits;
the method comprises determining that a total number of bits to be programmed for the first group of the set of sense amplifier addresses is less than the allowable number of parallel programmable bits;
the method comprises determining that a total number of bits to be programmed for a second group of at least two sense amplifiers of the set is less than the allowable number of parallel programmable bits;

programming the first group of at least two sense amplifier addresses in a first sense amplifier address cycle; and programming the second group of at least two sense amplifier addresses in a second sense amplifier address cycle.

22. A method according to claim 16, wherein:

grouping the at least two sense amplifier addresses comprises generating bitmap data for the at least two sense amplifier addresses that identifies the first group; and storing the bitmap data in a set of data latches during a read before write operation executed before a write operation for the set of user data.

* * * * *